United States Patent
Yokoo et al.

(10) Patent No.: US 6,388,426 B1
(45) Date of Patent: May 14, 2002

(54) BATTERY POWER SOURCE PROTECTING DEVICE FOR AN ELECTROMOTIVE DEVICE

(75) Inventors: Sadaaki Yokoo, Ikoma; Kenji Tanaka, Urayasu; Hironori Ura, Hiratsuka; Kanako Kasai, Fujisawa, all of (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 09/850,736

(22) PCT Filed: Sep. 11, 2000

(86) PCT No.: PCT/JP00/06210

§ 371 Date: May 18, 2001

§ 102(e) Date: May 18, 2001

(87) PCT Pub. No.: WO01/22107

PCT Pub. Date: Mar. 29, 2001

(30) Foreign Application Priority Data

Sep. 21, 1999 (JP) .......................... 11-266564

(51) Int. Cl.[7] .............................. H02J 7/16; H02J 7/04; H02J 7/00
(52) U.S. Cl. ......................... 320/136; 320/162; 320/150
(58) Field of Search ................................. 320/136, 162, 320/150, 134

(56) References Cited

U.S. PATENT DOCUMENTS 4,558,281 A 12/1985 Codd et al.
5,343,137 A 8/1994 Kitaoka et al.
5,453,904 A 9/1995 Higashiyama et al.
5,554,919 A 9/1996 Uchida

FOREIGN PATENT DOCUMENTS

| EP | 665628 | 8/1995 |
| JP | 6-303728 | 10/1994 |
| JP | 9-266014 | 7/1997 |

OTHER PUBLICATIONS

English Language Language Abstract of JP 9–266014—Jul. 10, 1997 (See above).
English Language Language Abstract of jp 6–303728—Oct. 28, 1994 (See Above).

*Primary Examiner*—Gregory Toatley
(74) *Attorney, Agent, or Firm*—Greenblum & Bernstein, P.L.C.

(57) ABSTRACT

A control circuit measures the battery voltage, intermediate voltage and discharge current of a rechargeable battery comprising a plurality of cells connected in series, at prescribed time intervals, and detects values for these parameters based on running averages for a prescribed number of measurement operations, while also detecting the battery temperature. If the battery temperature becomes equal to or greater than a prescribed temperature, or if the discharge current is an excessive current equal to or greater than a prescribed value, or if the battery voltage is equal to or less than a prescribed value, or if it is judged, from detection of the intermediate voltage that the balance between cell capacities has declined, then the control circuit halts discharge from the rechargeable battery by switching an FET to OFF.

22 Claims, 3 Drawing Sheets

BATTERY POWER SOURCE PROTECTING DEVICE FOR AN ELECTROMOTIVE DEVICE

TECHNICAL FIELD

The present invention relates to a battery power source device comprising the function of protecting a rechargeable battery from excessive discharge current or a state of excessive discharge, and to an electromotive device using such a battery power source device.

BACKGROUND ART

When a rechargeable battery is allowed to enter a state of excessive discharge, or is used at an excessive discharge current, battery characteristics are degraded and battery lifetime is markedly reduced. Therefore, an excessive discharge prevention circuit and/or excessive current prevention circuit are provided, these circuits being integrated with the rechargeable battery to constitute a battery power source device, such as a battery pack, or the like. The aforementioned excessive discharge prevention circuit provides control whereby discharge is halted when a voltage equal to or lower than a discharge halt voltage at which discharging must be stopped is detected. The aforementioned excessive current prevention circuit detects an excessive current flowing through the discharge circuit based on voltage, and it performs control whereby discharge is halted if a voltage corresponding to an excessive current is detected.

However, in cases where an inrush current arises when the power is switched on in a device connected to the battery power source device, the voltage of the rechargeable battery is reduced as a result of this inrush current, and if the voltage falls to a value equal to or lower than the aforementioned discharge halt voltage, then the excessive discharge prevention circuit will shut off the discharge circuit, and the device will enter a non-operational state. This situation also applies similarly to an excessive current prevention circuit in that discharge will be halted if the inrush current is detected as an excessive current.

Japanese Patent Laid-open No. (Hei)9-266014 discloses the construction of a battery pack which prevents malfunction of an excessive discharge prevention circuit due to the occurrence of inrush current. In this construction, a time-constant circuit is provided on the input side of a battery voltage detection circuit, in such a manner that voltage reductions of short time period caused by inrush current are not detected. Moreover, it is also disclosed that by providing a timer function at the output side of the aforementioned detection circuit, the detection output is halted during voltage reductions of short time period.

Furthermore, Japanese Patent Laid-open No. (Hei)6-303728 discloses a construction for preventing malfunction of an excessive current preventing circuit due to inrush current. In this construction, a capacitor is provided on the input side of a control circuit which halts the discharge circuit when excessive current is detected, and therefore, since the voltage for detecting excessive current is not generated in the control circuit until the capacitor has become charged, any inrush current of short time duration will not be detected.

If a battery power source device is used in a device generating significant load fluctuations, such as an electric power tool, or the like, then the rechargeable battery will be exposed to harsh operating conditions.

Inrush current is generated repeatedly due to frequent ON/OFF switching operations, and the rechargeable battery must also be protected from excess load conditions, or high-temperature conditions, due to motor locking operations, or the like. Such situations cannot be managed satisfactorily simply by means of a control circuit for preventing malfunction due to inrush current according to the prior art constructions described above. In the case where an alkaline rechargeable battery such as a nickel metal hydride battery is used, because of the low output voltage (nominal voltage : 1.2V) of the battery, a battery power source is constituted by connecting a plurality of cells in series. However, if there is variation in battery capacity between the plurality of cells, then when the cell having the smallest capacity has completely discharged, it will start to be charged inversely by the other cells, thereby provoking breakdown of the battery and degradation of battery characteristics.

It is an object of the present invention to provide a battery power source device whereby shortening of battery lifetime is prevented by means of a control structure which prevents a battery from being used in predetermined unfavorable conditions.

DISCLOSURE OF THE INVENTION

In order to achieve the aforementioned object, the present invention according to a first aspect thereof provides a battery power source device comprising:

a rechargeable battery, wherein a discharge circuit is formed; and discharge control means for controlling discharge of said rechargeable battery, wherein said discharge control means measures the voltage and discharge current of said rechargeable battery a prescribed number of times at prescribed time intervals, detects a battery voltage value and a discharge current value for each unit consisting of said prescribed number of measurement operations from running averages for said unit of measurement operations, detects the battery temperature of said rechargeable battery, and shuts off the discharge circuit of said rechargeable battery, if said battery voltage value, discharge current value and battery temperature assume any one of the states (1), (2), (3) described below:

(1) if a state where said battery voltage value is less than or equal to a predetermined undercut voltage value is detected consecutively for a prescribed number of measurement operations or more;

(2) if a state where said discharge current value is equal to or greater than a predetermined excessive current value is detected consecutively for a prescribed number of measurement operations or more;

(3) if said battery temperature is equal to or greater than a predetermined temperature.

According to the above described first aspect of the present invention, since the battery voltage and discharge current are measured at prescribed time intervals and are detected by means of the running average for each prescribed number of measurement operations, it is possible to detect the voltage and current in a suitable manner, even when the rechargeable battery is being used in a state where there are severe fluctuations in load and the voltage and current vary significantly, as in an electric power tool. Since an excessive discharge state of the rechargeable battery is identified if a state where the detected battery voltage value is equal to or lower than a predetermined undercut voltage value is detected continuously for a prescribed number of measurement operations or more, it is possible to shut off the discharge circuit, thereby halting battery discharge, in such circumstances. Consequently, the rechargeable battery can be protected from degradation due to excessive discharge. Moreover, if a state where the detected discharge current value is equal to or greater than a predetermined excessive current value is detected continuously for a prescribed number of measurement operations or more, then it is judged that the discharge current is exceeding the rated current of the rechargeable battery, thereby causing degradation of the rechargeable battery, and hence discharge can be halted in such circumstances by shutting off the discharge circuit. Moreover, if the battery temperature is equal to or greater than a predetermined temperature value, then this may cause deterioration of battery characteristics and lead to degradation or damaging of the battery, and hence discharge can be halted in such circumstances by shutting off the discharge circuit.

The rechargeable battery in the battery power source device of the present invention is constituted by a plurality of cells connected in series. According to a second aspect of the present invention, the discharge control means measures the respective unit voltages of each cell or each block of a plurality of cells, in addition to the voltage and discharge current of the rechargeable battery, and, respectively detects the unit voltage values, the battery voltage value and discharge current value for each unit consisting of a prescribed number of measurement operations from the running averages for the unit of measurement operations. The discharge circuit of the rechargeable battery is shut off, if the battery voltage value, discharge current value and battery temperature assume any one of the above described states (1), (2), (3), or if a state where the difference between the smallest value and the next to smallest value of the respective unit voltage values is equal to or greater than a predetermined allowable value is detected consecutively for a prescribed number of measurement operations or more.

According to this second aspect of the present invention, if a state where the difference between the smallest value and the next to smallest value of the respective unit voltage values is equal to or greater than a predetermined allowable value is detected for a prescribed number of measurement operations or more, then this indicates that the capacity of one of the cells has declined due to discharging of the rechargeable battery, and hence discharge is halted by shutting off the discharge circuit.

The above described battery power source of the present invention can advantageously used in an electromotive device using the battery power source device as a driving power source to drive a motor in rotation. The discharge control means starts measuring the voltage and discharge current of the rechargeable battery from the time that the electromotive device is switched on, and shuts off the discharge circuit if any of the states (1) to (3) described above is detected.

Alternatively, according to a fourth aspect of the present invention, since the rechargeable battery in the battery power source device is constituted by a plurality of cells connected in series, the discharge control means can measure the respective unit voltages of each cell or each block of a plurality of cells, in addition to the voltage and discharge current of the rechargeable battery, and, respectively detect the unit voltage values, the battery voltage value and discharge current value for each unit consisting of a prescribed number of measurement operations from the running averages for the unit of measurement operations. And the discharge circuit of the rechargeable battery is shut off, if the battery voltage value, discharge current value and battery temperature assume any one of the above described states (1), (2), (3), or if a state where the difference between the smallest value and the next to smallest value of the respective unit voltage values is equal to or greater than a predetermined allowable value is detected consecutively for a prescribed number of measurement operations or more.

In any of the first to fourth aspects of the present invention described above, the undercut voltage value can be derived as a voltage value which is specified according to the discharge current value and battery temperature.

Therefore, an undercut voltage value can be determined from the corresponding voltage value by detecting the discharge current value and battery temperature.

Specifically, the undercut voltage value can be set by multiplying a voltage value specified for each cell according to the discharge current value, by the number of serially connected cells. Since a voltage value corresponding to the cell discharge current value is previously obtained, the undercut voltage for the rechargeable battery or for a block of cells can be determined by multiplying this voltage value by the appropriate number of serially connected cells.

Preferably, the battery power source device should adopt a construction wherein, the shut-off state of the discharge circuit is locked and a recharge advice display recommending recharging is implemented, when the battery voltage value or the unit voltage value falls below the undercut voltage value. In a state of excessive discharge, further discharge is not possible and recharging is necessary, and consequently, discharge is halted and recharging is recommended by means of a display.

The battery power source device may further comprise control conditions setting means for changing the setting values for the control operation of shutting off the discharge circuit, as desired. Since the setting values for the control operation can be changed as desired in accordance with the type of equipment and the type of rechargeable battery being used, it is possible to increase the general compatibility of the battery power source device.

The electromotive device may further comprise reset means so that the shut-off state of the discharge circuit can be cancelled by an OFF operation of the electric power tool or a reset operation of the resetting means. A shut-off of the discharge circuit due to a temporary irregular state can be cancelled by such an OFF operation or reset operation, but if the discharge circuit has been shut off due to excessive discharge, or the like, then after cancelling, the discharge circuit will be shut off again.

Preferably, the rechargeable battery should comprise one of a nickel metal hydride battery and a nickel cadmium battery. These types of battery are rechargeable batteries having high energy density suitable for use as driving sources for electric power tools, or the like, and by implementing discharge control, it is possible to prevent degradation thereof and achieve a long operational lifetime thereof.

BEST MODE FOR CARRYING OUT THE INVENTION

Below, one embodiment of the present invention is described with reference to the accompanying drawings in order to provide an understanding of the present invention. The embodiment herein described is one concrete example of the present invention and does not limit the technical scope of the present invention.

The first embodiment of the present invention describes a concrete example according to a battery power source device applied to an electric power tool where the battery is subjected to the most severe operating conditions, in an electromotive device where a motor is driven in rotation by using a battery as a power source. In particular, the electric power tool relating to the present embodiment is an electrically powered drill which is used in a plurality of applications, such as drilling, screw-driving, and the like, where the operating conditions are not necessarily constant.

Figure 1:
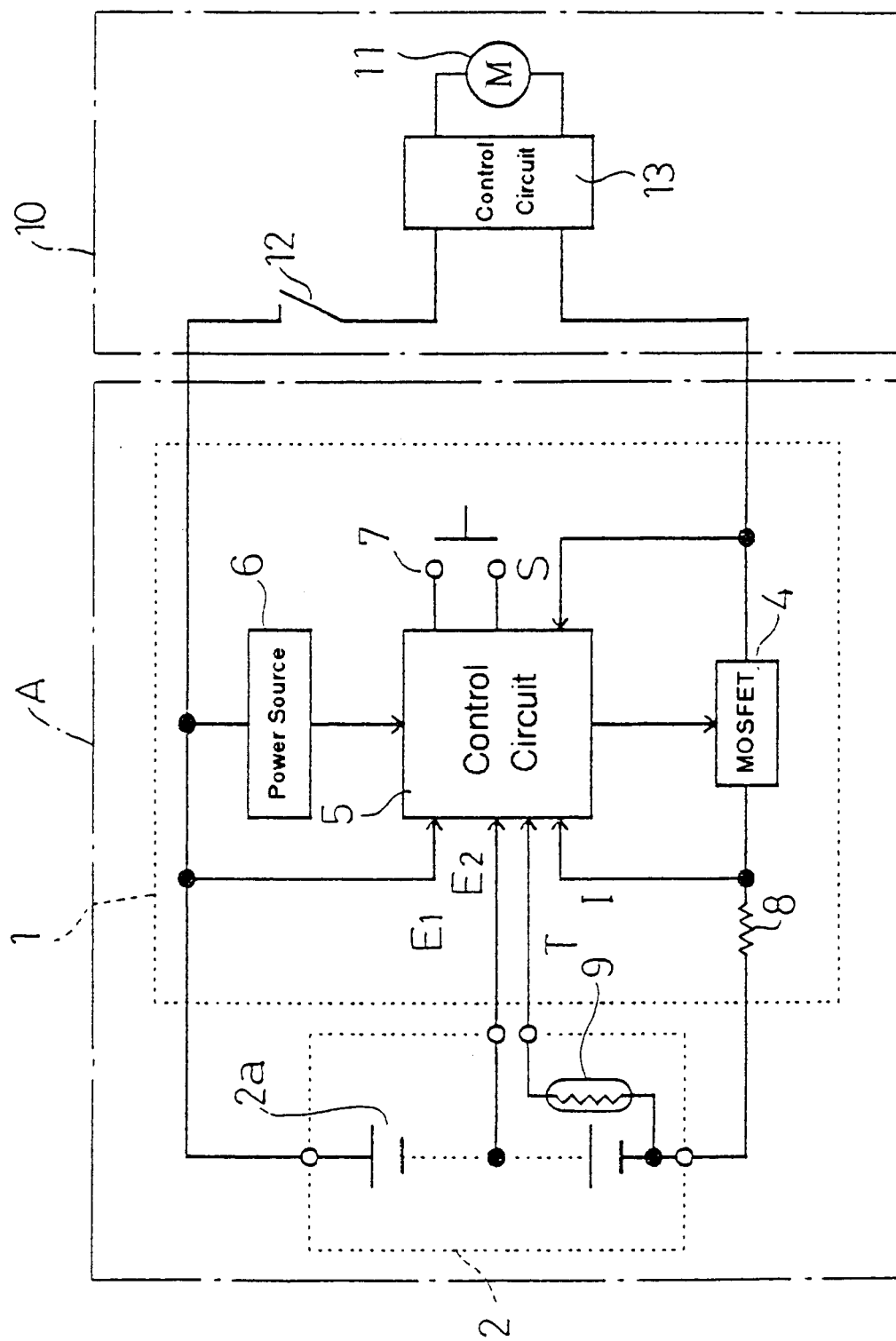
FIG. 1 is a block diagram showing the construction of an electric power tool using a battery power source device according to a first embodiment of the present invention.

In FIG. 1, an electric power tool 10 is constituted in such a manner that a DC motor 11 is driven and caused to rotate by means of an electric power supply from a battery power source device A, on/off switching of the motor rotation being effected by means of a trigger switch 12 and the speed of rotation being controllable by means of a speed control circuit 13. The battery power source device A supplying electromotive power to the power tool 10 comprises a rechargeable battery 2 and a discharge control device (discharge control means) 1 for controlling the discharge of the rechargeable battery 2, this battery power source device A being installed in the power tool 10 to achieve cordless operation of the power tool 10, and control being provided by the discharge control device 1 to protect the rechargeable battery 2 from excessive discharging, excessive discharge current, and irregular conditions, such as high temperature conditions, or the like.

The rechargeable battery 2 is constituted by 10 cells 2a formed by nickel metal hydride batteries of nominal voltage 1.2V, arranged in series, in the form of a battery pack accommodated inside a pack case along with a thermistor 9 for detecting the battery temperature. Moreover, an intermediate voltage detection terminal for detecting the intermediate voltage at an intermediate point between the 10 cells 2a connected in series is also provided.

Figure 2:
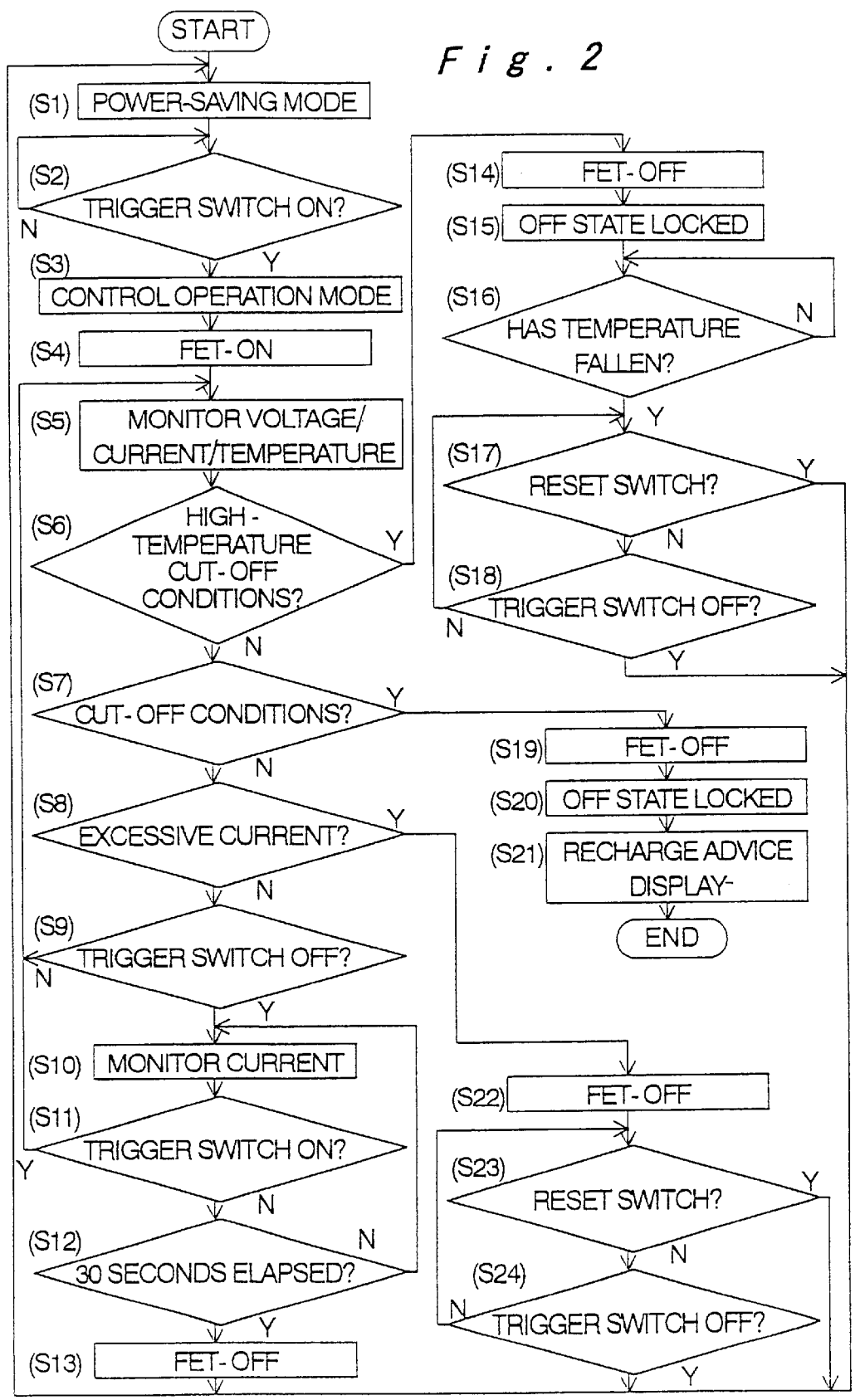
FIG. 2 is a flowchart showing the control operations performed by a battery power source device according to the first embodiment.

The discharge control device 1 is constituted by a control circuit (control means) 5 and a power MOSFET 4, and it is operated by means of an electric power supply from a stabilized power source 6. The control circuit 5 is constituted by a microcomputer equipped with an AD converter, which performs AD conversion of various input data, such as the voltage $E_1$ of the rechargeable battery 2, the intermediate voltage $E_2$, the battery temperature T, and the rechargeable battery discharge current I, and the control circuit 5 shuts off the discharge circuit of the rechargeable battery 2 by switching the power MOSFET 4 to OFF, when previously determined discharge halt conditions are detected. The discharge control procedure implemented by the discharge control device 1 is described here with reference to the flowchart illustrated in FIG. 2. The numerals S1, S2, ... shown in FIG. 2 are step numbers indicating the sequence of processing, and they match the numbers employed in the text description.

When the trigger switch 12 of the power tool 10 is in an OFF state, the discharge control device 1 assumes power-saving mode for restricting the power consumption thereof, and hence wear on the rechargeable battery 2 is restricted when the power tool 10 is in an non-operational state (S1). In this power-saving mode, no gate voltage is supplied to the power MOSFET 4 by the control circuit 5, so the power MOSFET 4 assumes an OFF state, and the discharge circuit of the rechargeable battery 2 assumes a disconnected state. From this state, if the trigger switch 12 of the power tool 10 is turned to ON (S2), then since the power MOSFET 4 is in an OFF state, the positive electrode voltage of the rechargeable battery 2 is input via the motor 11 to the control circuit 5 as a monitor voltage S. Upon input of this monitor voltage S, the control circuit 5 rises from power-saving mode to control operation mode (S3) and switches the power MOSFET 4 to an ON state (S4), whereby a discharge circuit is formed from the rechargeable battery 2 to the motor 11 and the power tool 10 assumes an operational state by means of rotation of the motor 11.

Simultaneously upon entering control operation mode, the control circuit 5 starts to monitor changes in the battery voltage $E_1$, intermediate voltage $E_2$, battery temperature T and discharge current I of the rechargeable battery 2 (S5). The discharge current I is detected from voltage changes produced in a shunt resistance 8 disposed in series with the discharge circuit of the rechargeable battery 2, and the battery temperature T is detected from voltage changes caused by changes in the resistance value of the thermistor 9 in response to temperature. Furthermore, the discharge current I, battery voltage $E_1$, and intermediate voltage $E_2$ are detected respectively at prescribed time intervals (for example, 100 ms,) their values being derived by a running average process for every prescribed number of values (for example, every 8 measurement operations).

By detecting the battery temperature T, it is determined whether or not the temperature of the rechargeable battery 2 has reached a high-temperature cut-off condition which exceeds the allowable operating temperature (for example, 80° C.), and if a high-temperature cut-off condition has been reached (S6), then the power MOSFET 4 is switched to OFF and discharge is halted (S14). A state where the battery temperature T has exceeded the allowable operating temperature is a state where there is excessive discharge, excessive discharge current, excessive ambient temperature, or the like, and hence the control circuit 5 halts operation of the rechargeable battery by switching the power MOSFET 4 to OFF. Since the electrical characteristics of the battery vary with battery temperature and tend to decline at high temperatures in particular, it is possible to prevent degradation of the lifetime of the rechargeable battery 2, by controlling the battery in such a manner that it is not used in conditions exceeding a predetermined allowable operating temperature.

A ROM within the control circuit 5 stores an undercut voltage table which records the voltages of the cells 2a corresponding to battery temperature and discharge current, as illustrated in Table 1. When a battery voltage $E_1$ and an intermediate voltage $E_2$ are detected, these detected values are compared with the undercut voltage as shown in Table 1 that corresponds to a detected battery temperature T. Since the battery voltage $E_1$ is the voltage value for 10 cells 2a connected in series, the undercut voltage U is given by multiplying the corresponding figure in the undercut voltage table by a factor of 10. This undercut voltage U is a voltage value previously specified as a discharge halt voltage for the rechargeable battery 2, and since any discharge exceeding this voltage is liable to degrade the rechargeable battery 2, as stated previously, the derived undercut voltage U is compared with the detected battery voltage $E_1$ and intermediate voltage $E_2$, as shown in equations (1) and (2) below, $$(E_1-E_2) \times 2 < U \quad (1)$$

$$E_2 \times 2 < U \quad (2)$$

and if either of the states indicated by equation (1) or (2) is detected continuously for a prescribed period of time (for example, 2 sec) or more, then the battery capacity of the rechargeable battery 2 is in a state approaching discharge limit conditions, and it is judged that undercut conditions, where the battery capacity has been reduced to the discharge limit, have arisen within the cells 2a connected in series (S7), whereupon the power MOSFET 4 is switched to OFF (S19).

TABLE 1

| Current (A) | | | | | | | | | |
|---|---|---|---|---|---|---|---|---|---|
| 100 | 0.5 V | 0.5 V | 0.5 V | 0.5 V | 0.5 V | 0.5 V | 0.5 V | 0.5 V | |
| 60 | 0.6 V | 0.6 V | 0.6 V | 0.6 V | 0.6 V | 0.6 V | 0.6 V | 0.6 V | |
| 35 | 0.7 V | 0.7 V | 0.7 V | 0.7 V | 0.7 V | 0.7 V | 0.7 V | 0.7 V | |
| 18 | 0.8 V | 0.8 V | 0.8 V | 0.8 V | 0.8 V | 0.8 V | 0.8 V | 0.8 V | |
| 8 | 1.0 V | 1.0 V | 1.0 V | 1.0 V | 1.0 V | 1.0 V | 1.0 V | 1.0 V | |
| 0 | | | | | | | | | |
| | −30 | −15 | 0 | 15 | 30 | 45 | 60 | 75 | |
| | | | | TEMPERATURE (° C.) | | | | | |

A nickel metal hydride battery has certain discharge characteristics, wherein, while the terminal voltage changes little as time passes, the terminal voltage tends to decline sharply in the vicinity of discharge termination. This voltage at which the terminal voltage starts to decline is set as the discharge halt voltage, and generally, discharge is terminated when this discharge halt voltage is detected. However, if the discharge halt voltage is set to a low value, then this will shorten the lifetime of a nickel metal hydride battery. Therefore, here, the aforementioned undercut voltage is set to the optimum terminal voltage for halting discharge of the battery.

Furthermore, in cases where a plurality of cells 2a are connected in series, disparities in residual capacity after discharge will arise due to variations in cell characteristics, and any cell 2a which has finished discharging will be charged inversely by the other cells 2a and assume reverse polarity, greatly degrading the performance of the battery. Therefore, by simultaneously detecting an intermediate voltage $E_2$ at an intermediate position within the cells connected in series, in addition to the terminal voltage $E_1$ at either end of the rechargeable battery 2, and comparing the terminal voltage $E_1$ detected for the whole rechargeable battery 2 and the intermediate voltage $E_2$ detected at an intermediate position thereof with the undercut voltage U, as illustrated by equation (1) above, it is possible to detect situations where the battery capacity of a specific individual cell 2a has declined, and hence deterioration of a cell 2a which has discharged excessively due to variations in battery properties can be prevented. In this embodiment, the intermediate voltage $E_2$ is detected at one intermediate position, but the cells can be divided into a more number of groups to provide a plurality of such intermediate voltages. Thereby, the state of discharge of the cell 2a can be detected more precisely. On the other hand, this causes the circuit construction of the control circuit 5 and the control judgement value setting circuit to become more complex, and leads to increased costs. In the case where 10 cells are connected in series, detection of only one intermediate voltage $E_2$ at a single point will suffice to prevent excessive discharge due to variations in battery characteristics.

Moreover, if a state where the discharge current value I exceeds a designated current value is detected continuously for a prescribed period of time, then this is taken as an excessive discharge current (S8), and hence the power MOSFET 4 is controlled to OFF (S22). At step S4 described above, when the power MOSFET 4 is switched to an ON state, an inrush current flows to the motor 11, but unless a discharge current equal to or exceeding a prescribed value is detected continuously for a prescribed time period (for example, 1 sec) or longer, when the battery voltage $E_1$ is detected at prescribed time intervals, then this is treated as being an inrush current. In other words, since the inrush current is a phenomenon of short time duration of less than one second, it is not judged to represent an excessive discharge current in cases where it is only detected for a prescribed period of time or less. However, if a discharge current equal to or exceeding a prescribed value is detected continuously for a period longer than the prescribed time period (for example, 2 sec) (S8), then it is judged to be an excessive discharge current due to shorting, motor locking, or the like, and hence the power MOSFET 4 is controlled to an OFF state and discharge is halted (S22).

Due to the conditions of use of a power drill, the rotation thereof frequently becomes locked during operation, but if battery discharge is halted each time an excessive lock current is generated in such a situation, the power drill becomes very inconvenient to use. However, if an excessive discharge current such as a lock current flows for a long period of time, then it can cause rapid wearing of the rechargeable battery 2. Therefore, by setting the power MOSFET 4 to OFF, thereby halting battery discharge, when an excessive discharge current is detected continuously for a prescribed period of time or more, as described above, it is possible to suppress wearing of the rechargeable battery 2, without reducing the convenience of use of the power drill.

In normal operation when the discharge halt processing according to steps S6–S8 described above is not implemented, the power MOSFET 4 is maintained in an ON state, and if the trigger switch 12 is turned OFF (S9), then the discharge current is monitored (S10), and if the trigger switch 12 remains in an ON state for 30 seconds or more (S12), then the power MOSFET 4 is controlled to OFF (S13), and the initial state, power-saving mode (S1), is assumed. However, if it is detected from monitoring of the discharge current that the trigger switch 12 has been switched ON (S11), then the procedure shifts to step S5, where operations for detecting irregularities in the state of battery discharge are implemented.

Moreover, if the power MOSFET 4 has been controlled to OFF in the processing operation at step S6 due to the occurrence of a high-temperature cut-off state (S14), then this OFF state is locked (S15), and the device is not switched back to the initial power-saving mode (S1), thereby assuming an operable state, unless either the battery temperature T falls to an allowable operating temperature (S16), or the discharge halt control operation is cleared by operation of a reset switch 7 (S17), or the trigger switch 12 is turned to an OFF state (S18).

Furthermore, if the power MOSFET 4 has been controlled to OFF in the processing operation at step S7, due to the occurrence of undercut conditions (S19), then this OFF state is locked (S20), and a recharge advice display recommending recharging of the rechargeable battery 2 is implemented (S21). A state where undercut conditions have occurred is a state where the capacity of the rechargeable battery 2 has diminished to a discharge halt state, and since the capacities of the respective cells 2a are not in a uniform state, it is devised that the power tool 10 cannot be used, even if the reset switch 7 and trigger switch 12 are operated. Upon display of the aforementioned recharge advice, the user promptly implements charging of the rechargeable battery 2. After charging has been completed, the device assumes the power-saving mode in step S1, thereby entering a normal operable state.

If the power MOSFET 4 has been controlled to OFF in the processing operation at step S8 due to detection of an excessive current (S22), then the device can be returned to the initial state power-saving mode (S1), thereby assuming an operable state, either by clearing the discharge halt control operation by operating the reset switch 7 (S23), or by switching the trigger switch 12 to OFF (S24).

Figure 3:
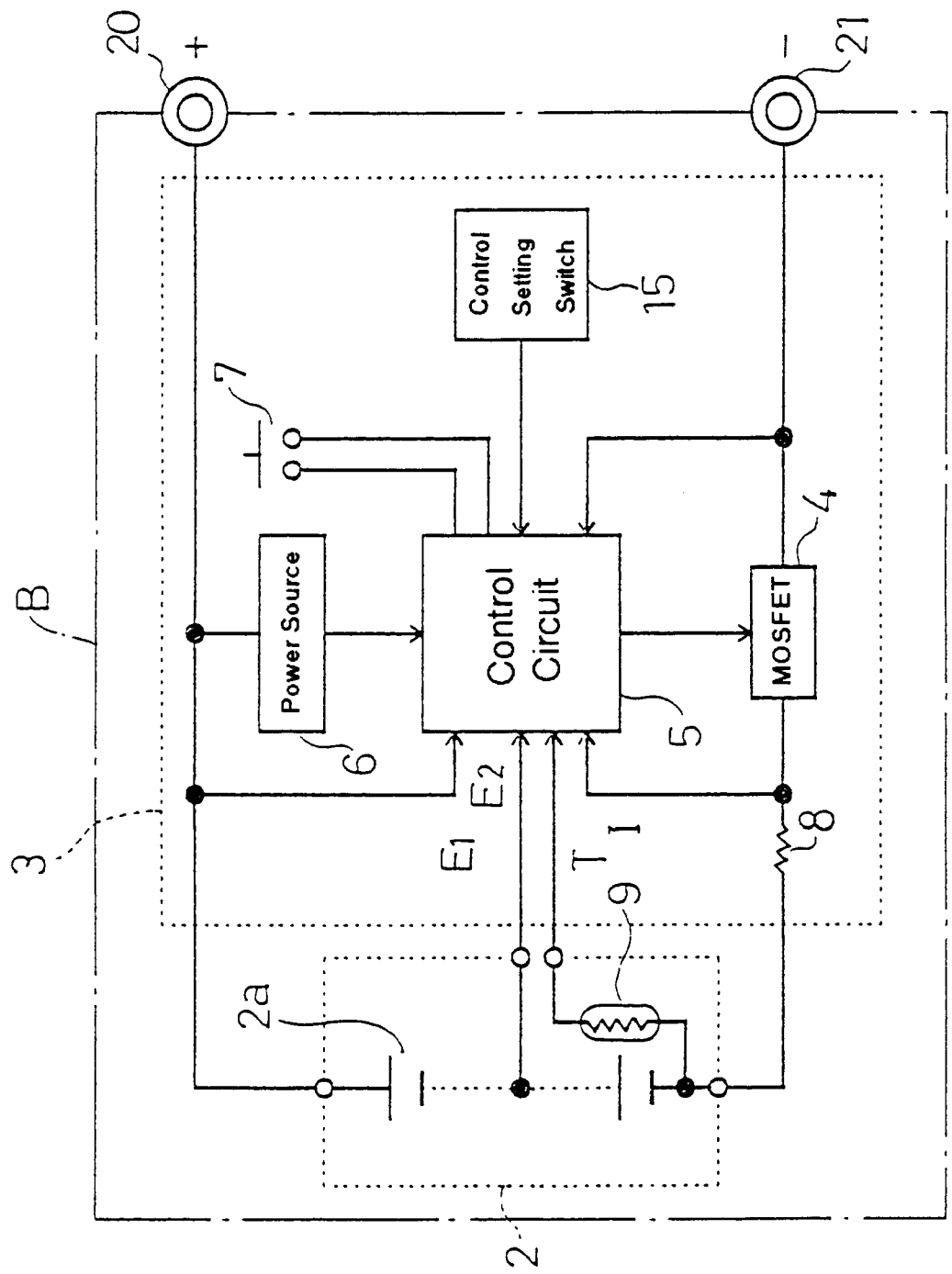
FIG. 3 is a block diagram showing the construction of a battery power source device according to a second embodiment of the present invention.

The battery power source device A according to the first embodiment described above is constituted as a device which is incorporated in a power tool 10, but it is also possible to constitute a battery power source device in such a manner that the conditions under which a discharge halt operation is performed can be changed according to the type of equipment to which it is applied. FIG. 3 illustrates the construction of a battery power source device B relating to a second embodiment, wherein a control conditions setting switch 15 is provided. Elements which are common with the construction of the first embodiment are similarly labelled and description thereof is omitted here.

In FIG. 3, the conditions of the discharge halt operation performed by the control circuit 5 in the battery power source device B can be changed according to the type of equipment connected to the positive and negative output terminals 20, 21, and the type of rechargeable battery 2 used. Various conditions are provided in the control conditions setting switch (control conditions setting means) 15 relating to the high-temperature cut-off conditions for shutting off discharge when the rechargeable battery 2 reaches a high temperature, excessive current cut-off conditions for shutting off discharge when an excessive discharge current is detected, and undercut conditions when the voltage of the rechargeable battery 2 has declined, or when the balance of the capacities of the individual cells 2a has declined, and hence it is possible to set optimum discharge halt conditions according to the type of equipment connected and the type of rechargeable battery 2 used.

The discharge control operations performed by the battery power source device B are similar to the construction of the first embodiment, and hence further description thereof is omitted here.

The construction described above relates to an example where a nickel metal hydride battery is used as a rechargeable battery 2, but it is also possible to achieve a similar construction using a nickel cadmium battery as a rechargeable battery 2.

Industrial Applicability

According to the present invention as described above, degradation of the rechargeable battery due to excessive discharge current or an excessive discharge state can reliably be prevented. Moreover, since the battery power source device is controlled by means of a time detection function, the discharge circuit is not shut off in cases of a momentary excessive discharge current caused by inrush current when the electromotive device using the battery power source device is started, or caused by intermittent operation of the device, and therefore, no impediment is caused to the driving of the motor. Accordingly, the battery power source device of the present invention can advantageously be used in an electromotive device generating significant load fluctuations whereby the rechargeable battery in the battery power source device is exposed to harsh operating conditions.

What is claimed is:

1. A battery power source device comprising:
   a rechargeable battery having a discharge circuit; and
   a discharge control device that controls discharge of said rechargeable battery, wherein said discharge control device measures the voltage and discharge current of said rechargeable battery a prescribed number of times at prescribed time intervals, detects a battery voltage value and a discharge current value for each of said prescribed number of measurement operations from running averages for said measurement operations, detects the battery temperature of said rechargeable battery, and shuts off the discharge circuit of said rechargeable battery, when said battery voltage value, discharge current value and battery temperature satisfy any one of the following conditions:
   (1) when said battery voltage value at most equal to a predetermined undercut voltage value is detected consecutively for at least a prescribed number of measurement operations;
   (2) when said discharge current value at least equal to a predetermined excessive current value is detected consecutively for at least a prescribed number of measurement operations; and
   (3) when said battery temperature is at least equal to a predetermined temperature.

2. The battery power source device according to claim 1, wherein the undercut voltage value is a voltage value specified in accordance with the discharge current value and the battery temperature.

3. The battery power source device according to claim 1, wherein the shut-off state of the discharge circuit is locked and a recharge advice display recommending recharging is implemented, when the battery voltage value or the unit voltage value falls below the undercut voltage value.

4. The battery power source device according to claim 1, further comprising a control conditions setting device that changes the setting values for the shutting off of the discharge circuit.

5. A battery power source device comprising:
   a rechargeable battery, in which a discharge circuit is formed, said rechargeable battery comprising a plurality of cells connected in series; and
   a discharge control device that controls discharge of said rechargeable battery, wherein said discharge control device measures unit voltages of each cell and each block of a plurality of cells, and the voltage and discharge current of said rechargeable battery, a prescribed number of times at prescribed time intervals, detects unit voltage values, a battery voltage value and a discharge current value respectively for each of said prescribed number of measurement operations from running averages for said measurement operations, detects the battery temperature of said rechargeable battery, and shuts off the discharge circuit of said rechargeable battery, when said unit voltage values, battery voltage value, discharge current value and battery temperature satisfy any one of the following conditions:
   (1) when the difference between the smallest value and the next to smallest value of the respective unit voltage values, which is at least equal to dedetermined allowable value, is consecutively detected for at least a prescribed number of measurement operations;

(2) when said battery voltage value at most equal to a predetermined undercut voltage value is consecutively detected for at least a prescribed number of measurement operations;

(3) when said discharge current value at least equal to a predetermined current value is consecutively detected for at least a prescribed number of measurement operations; and (4) when said battery temperature is at least equal to predetermined temperature.

6. The battery power source device according to claim 5, wherein the undercut voltage value is a voltage value specified in accordance with the discharge current value and the battery temperature.

7. The battery power source device according to claim 5, wherein the undercut voltage value is a value obtained by multiplying the number of cells connected in series for constituting the rechargeable battery with a voltage value specified for each cell in accordance with the discharge current value.

8. The battery power source device according to claim 5, wherein the shut-off state of the discharge circuit is locked and a recharge advice display recommending recharging is implemented, when the battery voltage value or the unit voltage value falls below the undercut voltage value.

9. The battery power source device according to claim 5, further comprising a control conditions setting device that changes the setting values for the shutting off of the discharge circuit.

10. An electromotive device using a battery power source device as a driving power source to drive a motor in rotation, said battery power source device comprising a rechargeable battery having a discharge circuit: and a discharge control device that controls discharge of said rechargeable battery, wherein said discharge control device measures a voltage and discharge current of said rechargeable battery a prescribed number of times at prescribed time intervals when said electromotive device is in an ON state, detects a battery voltage value and a discharge current value for each of said prescribed number of measurement operations, from running averages for each of said measurement operations, detects the battery temperature of the rechargeable battery, and shuts off the discharge circuit of the rechargeable battery, when said battery voltage value, discharge current value and battery temperature satisfy any one of the following conditions:

(1) when said battery voltage value at most equal to a predetermined undercut voltage value is detected consecutively for at least a prescribed number of measurement operations;

(2) when said discharge current value at least equal to a predetermined current value is consecutively detected for at least a prescribed number of measurement operations; and (3) when said battery temperature is at least equal to a predetermined temperature.

11. The electromotive device using a battery power source device according to claim 10, wherein the undercut voltage value is a voltage value specified in accordance with the discharge current value and battery temperature.

12. The electromotive device using a battery power source device according to claim 10, further comprising a reset device, wherein the shut-off operation of the discharge circuit can be cancelled by an OFF operation of the electromotive device or by a reset operation of said reset device.

13. The electromotive device using a battery power source device according to claim 10, wherein the shut-off state of the discharge circuit is locked and a recharge advice display recommending recharging is implemented, when the battery voltage value or the unit voltage value falls below the undercut voltage value.

14. The electromotive device using a battery power source device according to claim 10, further comprising a control conditions setting device that changes the setting values for the shutting off of the discharge circuit.

15. The electromotive device using a battery power source device according to claim 10, wherein the rechargeable battery comprises one of a nickel metal hydride battery and a nickel cadmium battery.

16. An electromotive device using a battery power source device as a driving power source to drive a motor in rotation, said battery power source device comprising a rechargeable battery having a discharge circuit, said rechargeable battery comprising a plurality of cells connected in series; and a discharge control device that controlls discharge of said rechargeable battery, wherein said discharge control device measures unit voltages of one of each cell and each block of a plurality of cells, and the voltage and discharge current of said rechargeable battery, a prescribed number of times at prescribed time intervals, when said electromotive device is in an ON state, detects unit voltage values, a battery voltage value and a discharge current value for each of said prescribed number of measurement operations from running averages for said measurement operations, detects the battery temperature of the rechargeable battery, and shuts off the discharge circuit of said rechargeable battery, when said unit voltage values, battery voltage value, discharge current value and battery temperature satisfy any one of the following conditions:

(1) when the difference between the smallest value and the next to smallest value of the respective unit voltage values, is at least equal to a predetermined allowable value, is consecutively detected for at least a prescribed number of measurement operations;

(2) when said battery voltage value equal to at most a predetermined undercut voltage value is consecutively detected for at least a prescribed number of measurement operations;

(3) when said discharge current value at least equal to a predetermined current value is consecutively detected for at least a prescribed number of measurement operations; and (4) when said battery temperature is at least equal to a predetermined temperature.

17. The electromotive device using a battery power source device according to claim 16, wherein the undercut voltage value is a voltage value specified in accordance with the discharge current value and battery temperature.

18. The electromotive device using a battery power source device according to claim 16, wherein the undercut voltage value is a value obtained by multiplying the number of cells connected in series for constituting the rechargeable battery with a voltage value specified for each cell in accordance with the discharge current value.

19. The electromotive device using a battery power source device according to claim 16, further comprising a reset device, wherein the shut-off operation of the discharge circuit can be cancelled by an OFF operation of the electromotive device or by a reset operation of said reset device.

20. The electromotive device using a battery power source device according to claim 16, wherein the shut-off state of the discharge circuit is locked and a recharge advice display recommending recharging is implemented when the battery voltage value or the unit voltage value falls below the undercut voltage value.

21. The electromotive device using a battery power source device according to claim 16, further comprising a control conditions setting device that changes the setting values for shutting off of the discharge circuit.

22. The electromotive device using a battery power source device according to claim 16, wherein the rechargeable battery comprises one of a nickel metal hydride battery and a nickel cadmium battery.

* * * * *

UNITED STATES PATENT AND TRADEMARK OFFICE
CERTIFICATE OF CORRECTION

PATENT NO. : 6,388,426 B1
DATED : May 14, 2002
INVENTOR(S) : S. Yokoo et al.

It is certified that error appears in the above-identified patent and that said Letters Patent is hereby corrected as shown below:

<u>Title page,</u>
Item [73], Assignee, after "Co." insert -- , --.

<u>Column 12,</u>
Line 67, after "implemented" insert -- , --.
Line 18, "controlls" should be -- controls --.

Signed and Sealed this

Fifteenth Day of April, 2003

JAMES E. ROGAN
*Director of the United States Patent and Trademark Office*